(12) United States Patent
Aisenbrey

(10) Patent No.: US 7,326,463 B2
(45) Date of Patent: *Feb. 5, 2008

(54) CONDUCTIVE CIRCUITS OR CABLES MANUFACTURED FROM CONDUCTIVE LOADED RESIN-BASED MATERIALS

(75) Inventor: Thomas Aisenbrey, Littleton, CO (US)

(73) Assignee: Integral Technologies, Inc., Bellingham, WA (US)

( * ) Notice: Subject to any disclaimer, the term of this patent is extended or adjusted under 35 U.S.C. 154(b) by 14 days.

This patent is subject to a terminal disclaimer.

(21) Appl. No.: 11/057,534

(22) Filed: Feb. 14, 2005

(65) Prior Publication Data

US 2005/0199417 A1 Sep. 15, 2005

Related U.S. Application Data

(63) Continuation-in-part of application No. 10/309,429, filed on Dec. 4, 2002, now Pat. No. 6,870,516, which is a continuation-in-part of application No. 10/075,778, filed on Feb. 14, 2002, now Pat. No. 6,741,221.

(60) Provisional application No. 60/552,302, filed on Mar. 10, 2004, provisional application No. 60/317,808, filed on Sep. 7, 2001, provisional application No. 60/269,414, filed on Feb. 16, 2001, provisional application No. 60/268,822, filed on Feb. 15, 2001.

(51) Int. Cl.
*D02G 3/00* (2006.01)

(52) U.S. Cl. ............... 428/372; 428/364; 428/368; 428/407; 428/425.9; 252/506

(58) Field of Classification Search ........ 428/377–379, 428/385, 372, 364, 368, 407, 425.9
See application file for complete search history.

(56) References Cited

U.S. PATENT DOCUMENTS 3,168,617 A * 2/1965 Richter ................. 174/117 FF (Continued)

FOREIGN PATENT DOCUMENTS

EP 0 297 678 A1 * 1/1989

(Continued)

OTHER PUBLICATIONS

Co-pending U.S. Patent Int-04-002B, U.S. Appl. No. 11/057,535, filed Feb. 14, 2005, "Conductive Circuits or Cables Manufactured from Conductive Loaded Resin-Based Materials", assigned to the same assignee as the present invention.

*Primary Examiner*—Cathy F. Lam
(74) *Attorney, Agent, or Firm*—Douglas Schnabel

(57) ABSTRACT

Circuit conductors and cables are formed of a conductive loaded resin-based material. The conductive loaded resin-based material comprises micron conductive powder(s), conductive fiber(s), or a combination of conductive powder and conductive fibers in a base resin host. The percentage by weight of the conductive powder(s), conductive fiber(s), or a combination thereof is between about 20% and 50% of the weight of the conductive loaded resin-based material. The micron conductive powders are formed from non-metals, such as carbon, graphite, that may also be metallic plated, or the like, or from metals such as stainless steel, nickel, copper, silver, that may also be metallic plated, or the like, or from a combination of non-metal, plated, or in combination with, metal powders. The micron conductor fibers preferably are of nickel plated carbon fiber, stainless steel fiber, copper fiber, silver fiber, aluminum fiber, or the like.

25 Claims, 10 Drawing Sheets

U.S. PATENT DOCUMENTS

| | | | |
|---|---|---|---|
| 3,215,574 A * | 11/1965 | Korb | 216/20 |
| 4,199,637 A * | 4/1980 | Sado | 428/119 |
| 4,228,194 A * | 10/1980 | Meeder | 428/297.4 |
| 4,431,982 A * | 2/1984 | Monroe et al. | 338/214 |
| 5,087,494 A * | 2/1992 | Calhoun et al. | 428/40.1 |
| 5,233,753 A * | 8/1993 | Wolf et al. | 29/831 |
| 5,275,856 A * | 1/1994 | Calhoun et al. | 428/41.1 |
| 5,547,610 A * | 8/1996 | Mortensen | 252/514 |
| 5,925,467 A | 7/1999 | Strumpler et al. | 428/426 |
| 6,319,604 B1 * | 11/2001 | Xu | 428/379 |
| 6,426,143 B1 * | 7/2002 | Voss et al. | 428/378 |
| 6,490,169 B1 | 12/2002 | Watanabe | 361/784 |
| 6,533,963 B1 | 3/2003 | Schleifstein et al. | 252/511 |
| 7,005,179 B2 * | 2/2006 | Davidson et al. | 428/209 |
| 2002/0005571 A1 | 1/2002 | Jiang et al. | 257/666 |
| 2002/0043398 A1 | 4/2002 | Nakagawa et al. | 174/256 |
| 2003/0179551 A1 | 9/2003 | Sugimoto et al. | 361/748 |

FOREIGN PATENT DOCUMENTS

GB 377449 A 7/2001

* cited by examiner

CONDUCTIVE CIRCUITS OR CABLES MANUFACTURED FROM CONDUCTIVE LOADED RESIN-BASED MATERIALS

This application is related to U.S. patent application Ser. No. 11/057,535 and filed Feb. 14, 2005, owned by a common assignee as the instant invention.

This patent application claims priority to the U.S. Provisional Patent Application 60/552,302, filed on Mar. 10, 2004, which is herein incorporated by reference in its entirety.

This patent application is a Continuation-in-Part of filed as U.S. patent application Ser. No. 10/309,429, filed on Dec. 4, 2002, now U.S. Pat. No. 6,870,516 also incorporated by reference in its entirety, which is a Continuation-in-Part application of filed as U.S. patent application Ser. No. 10/075,778, filed on Feb. 14, 2002, now U.S. Pat. No. 6,741,221 which claimed priority to U.S. Provisional Patent Applications Ser. No. 60/317,808, filed on Sep. 7, 2001, Ser. No. 60/269,414, filed on Feb. 16, 2001, and Ser. No. 60/268,822, filed on Feb. 15, 2001.

BACKGROUND OF THE INVENTION (1) Field of the Invention

This invention relates to conductive circuit or cables and, more particularly, to conductive circuit or cables molded of conductive loaded resin-based materials comprising micron conductive powders, micron conductive fibers, or a combination thereof, substantially homogenized within a base resin when molded. This manufacturing process yields a conductive part or material usable within the EMF or electronic spectrum(s).

(2) Description of the Prior Art

Electrical and electronic circuit cabling is used in many applications. Circuit cabling is used to provide connectivity between circuit components. Typical cabling systems comprise metal wiring encased in insulating material. In a flexible cable system, a flexible wiring material, such as copper, silver, or the like, is used along with a flexible insulating material. Flexible cable systems of this type have several disadvantages. First, copper or silver metal wiring, or the like, is relatively heavy. Second, though flexible, these systems may not be as flexible as desired. Third, the systems are subject to corrosion problems if exposed to moisture or other environmental contaminates. Fourth, copper or silver wire based systems, or the like, can exhibit wire breakage. It is a primary object of the present invention to provide conductors and conductive cabling with improved performance in these areas.

Several prior art inventions relate to flexible circuits and conductive resin-based materials. U.S. Pat. No. 6,490,161 B1 to Watanabe teaches a circuit structure comprising conductive resin lines formed in a non-conductive resin substrate. Both conductive and non-conductive resin materials may be flexible or non-flexible. U.S. Patent Application 2003/0179551 to Sugimoto et al teaches a connection structure to connect between first and second circuit boards. The connection structure comprises a conductive resin layer. U.S. Patent Application 2002/0005571 to Jiang et al teaches a plastic lead frame for a semiconductor device. The lead frame and/or leads comprise a conductive plastic layer. U.S. Patent Application 2002/0043398 to Nakagawa et al teaches a lead-free, super-highly conductive plastic formed from a conductive resin composition. The conductive resin comprises a thermoplastic resin, a lead-free solder that melts during plasticization, and metal powder or a mixture of metal powder and metal short fibers. U.S. Pat. No. 6,533,963 B1 to Schleifstein et al teaches a flexible, conductive material comprising an elastic matrix and a particulate filler that may comprise fiber particles or spheroidal particles. U.S. Pat. No. 5,925,467 to Strumpler et al teaches a conductive plastic comprising polymer and filler where the filler comprises doped semiconductor materials such as doped metal oxides.

SUMMARY OF THE INVENTION

A principal object of the present invention is to provide an effective circuit conductor.

A further object of the present invention is to provide an effective circuit cable.

A further object of the present invention is to provide a method to form a circuit conductor.

A further object of the present invention is to provide a method to form a circuit cable.

A further object of the present invention is to provide a circuit conductor or cable molded of conductive loaded resin-based materials.

A further object of the present invention is to provide a method to form circuit conductors or cables via molding.

A further object of the present invention is to provide circuit conductors or cables with improved flexibility and tensile strength.

A yet further object of the present invention is to provide a circuit cable molded of conductive loaded resin-based material where the cable characteristics can be altered or the visual characteristics can be altered by forming a metal layer over the conductive loaded resin-based material.

A yet further object of the present invention is to provide methods to fabricate a circuit cable from a conductive loaded resin-based material incorporating various forms of the material.

A yet further object of the present invention is to provide a method to fabricate a circuit cable from a conductive loaded resin-based material where the material is in the form of a fabric.

In accordance with the objects of this invention, a conductor device is achieved. The conductor device comprises a conductor comprising a conductive loaded, resin-based material comprising conductive materials in a base resin host. An insulating layer surrounds the conductor.

Also in accordance with the objects of this invention, a conductor device is achieved. The device comprises a plurality of conductors each comprising a conductive loaded, resin-based material comprising conductive materials in a base resin host. The percent by weight of the conductive materials is between 20% and 40% of the total weight of the conductive loaded resin-based material. An insulating layer surrounds each conductor.

Also in accordance with the objects of this invention, a conductor device is achieved. The device comprises a plurality of conductors each comprising a conductive loaded, resin-based material comprising micron conductive fibers in a base resin host. The percent by weight of the micron conductive fibers is between 25% and 35% of the total weight of the conductive loaded resin-based material. An insulating layer surrounds each conductor.

Also in accordance with the objects of this invention, a method to form a conductor device is achieved. The method comprises providing a conductive loaded, resin-based material comprising conductive materials in a resin-based host. The conductive loaded, resin-based material is molded into a conductor. An insulating layer is formed over the conductor to complete the conductor device.

Also in accordance with the objects of this invention, a method to form a conductor device is achieved. The method comprised providing a conductive loaded, resin-based material comprising conductive materials in a resin-based host. The percent by weight of the conductive materials is between 20% and 40% of the total weight of the conductive loaded resin-based material. The conductive loaded, resin-based material is molded into a plurality of conductors. An insulating layer is formed over the conductors to complete the conductor device.

Also in accordance with the objects of this invention, a method to form a conductor device is achieved. The method comprises providing a conductive loaded, resin-based material comprising micron conductive fiber in a resin-based host. The percent by weight of the micron conductive fiber is between 25% and 35% of the total weight of the conductive loaded resin-based material. The conductive loaded, resin-based material is molded into a plurality of conductors. An insulating layer is formed over the conductors to complete the conductor device.

BRIEF DESCRIPTION OF THE DRAWINGS

In the accompanying drawings forming a material part of this description, there is shown.

DESCRIPTION OF THE PREFERRED EMBODIMENTS

Figure 1:
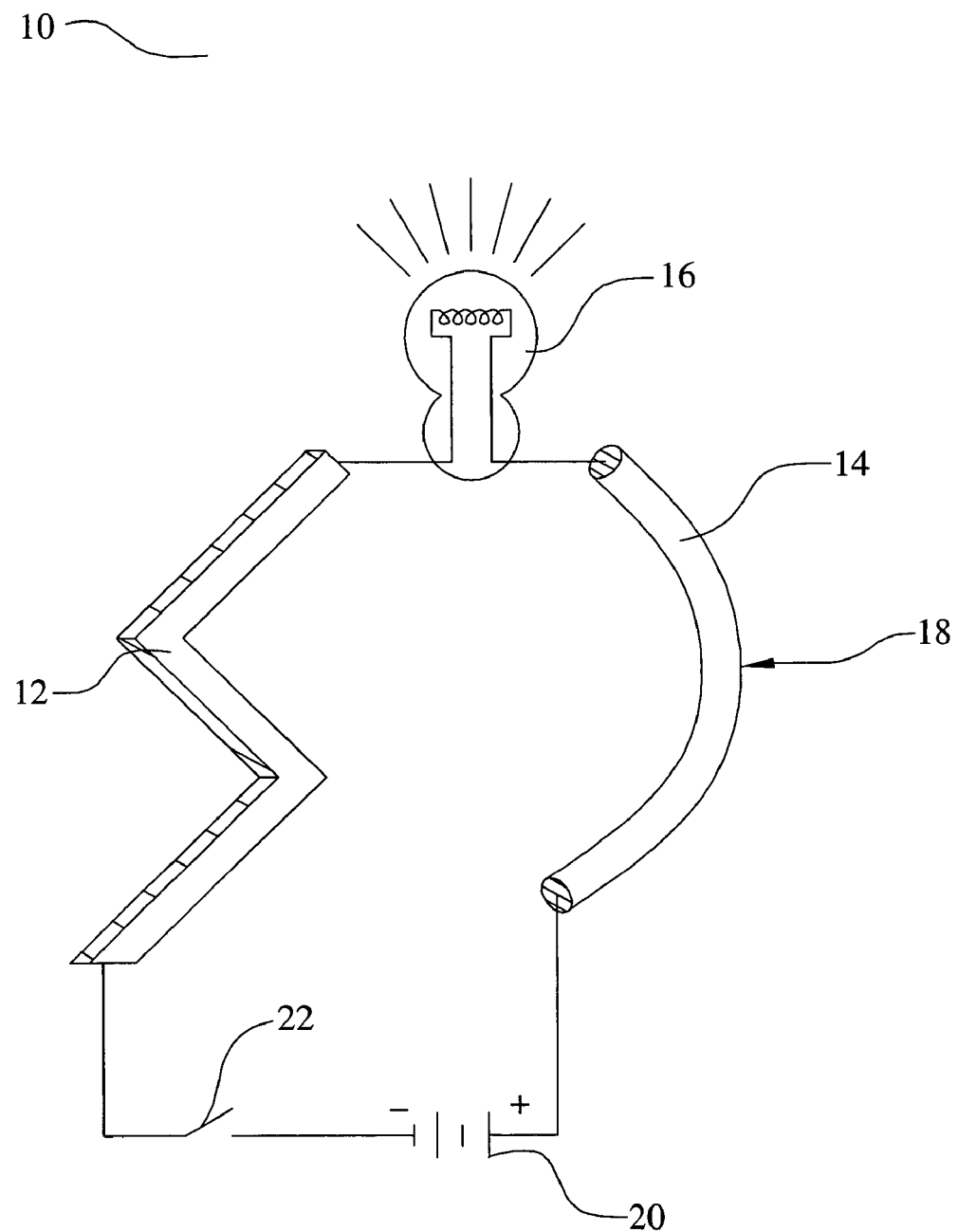
FIG. 1 illustrates a first preferred embodiment of the present invention showing a flexible circuit comprising conductive loaded resin-based material according to the present invention.

This invention relates to circuit conductors molded of conductive loaded resin-based materials comprising micron conductive powders, micron conductive fibers, or a combination thereof, substantially homogenized within a base resin when molded.

The conductive loaded resin-based materials of the invention are base resins loaded with conductive materials, which then makes any base resin a conductor rather than an insulator. The resins provide the structural integrity to the molded part. The micron conductive fibers, micron conductive powders, or a combination thereof, are substantially homogenized within the resin during the molding process, providing the electrical continuity.

The conductive loaded resin-based materials can be molded, extruded or the like to provide almost any desired shape or size. The molded conductive loaded resin-based materials can also be cut, stamped, or vacuumed formed from an injection molded or extruded sheet or bar stock, over-molded, laminated, milled or the like to provide the desired shape and size. The thermal or electrical conductivity characteristics of circuit conductors fabricated using conductive loaded resin-based materials depend on the composition of the conductive loaded resin-based materials, of which the loading or doping parameters can be adjusted, to aid in achieving the desired structural, electrical or other physical characteristics of the material. The selected materials used to fabricate the circuit conductor devices are substantially homogenized together using molding techniques and or methods such as injection molding, over-molding, insert molding, thermo-set, protrusion, extrusion or the like. Characteristics related to 2D, 3D, 4D, and 5D designs, molding and electrical characteristics, include the physical and electrical advantages that can be achieved during the molding process of the actual parts and the polymer physics associated within the conductive networks within the molded part(s) or formed material(s).

In the conductive loaded resin-based material, electrons travel from point to point when under stress, following the path of least resistance. Most resin-based materials are insulators and represent a high resistance to electron passage. The doping of the conductive loading into the resin-based material alters the inherent resistance of the polymers. At a threshold concentration of conductive loading, the resistance through the combined mass is lowered enough to allow electron movement. Speed of electron movement depends on conductive loading concentration, that is, the separation between the conductive loading particles. Increasing conductive loading content reduces interparticle separation distance, and, at a critical distance known as the percolation point, resistance decreases dramatically and electrons move rapidly.

The use of conductive loaded resin-based materials in the fabrication of circuit conductors significantly lowers the cost of materials and the design and manufacturing processes used to hold ease of close tolerances, by forming these materials into desired shapes and sizes. The circuit conductors can be manufactured into infinite shapes and sizes using conventional forming methods such as injection molding, over-molding, or extrusion or the like. The conductive loaded resin-based materials, when molded, typically but not exclusively produce a desirable usable range of resistivity from between about 5 and 25 ohms per square, but other resistivities can be achieved by varying the doping parameters and/or resin selection(s).

The conductive loaded resin-based materials comprise micron conductive powders, micron conductive fibers, or any combination thereof, which are substantially homogenized together within the base resin, during the molding process, yielding an easy to produce low cost, electrically conductive, close tolerance manufactured part or circuit. The resulting molded article comprises a three dimensional, continuous network of conductive loading and polymer matrix. The micron conductive powders can be of carbons, graphites, amines or the like, and/or of metal powders such as nickel, copper, silver, aluminum, or plated or the like. The use of carbons or other forms of powders such as graphite(s) etc. can create additional low level electron exchange and, when used in combination with micron conductive fibers, creates a micron filler element within the micron conductive network of fiber(s) producing further electrical conductivity as well as acting as a lubricant for the molding equipment. The micron conductive fibers can be nickel plated carbon fiber, stainless steel fiber, copper fiber, silver fiber, aluminum fiber, or the like, or combinations thereof. The structural material is a material such as any polymer resin. Structural material can be, here given as examples and not as an exhaustive list, polymer resins produced by GE PLASTICS, Pittsfield, Mass., a range of other plastics produced by GE PLASTICS, Pittsfield, Mass., a range of other plastics produced by other manufacturers, silicones produced by GE SILICONES, Waterford, N.Y., or other flexible resin-based rubber compounds produced by other manufacturers.

The resin-based structural material loaded with micron conductive powders, micron conductive fibers, or in combination thereof can be molded, using conventional molding methods such as injection molding or over-molding, or extrusion to create desired shapes and sizes. The molded conductive loaded resin-based materials can also be stamped, cut or milled as desired to form create the desired shape form factor(s) of the circuit conductors. The doping composition and directionality associated with the micron conductors within the loaded base resins can affect the electrical and structural characteristics of the circuit conductors and can be precisely controlled by mold designs, gating and or protrusion design(s) and or during the molding process itself. In addition, the resin base can be selected to obtain the desired thermal characteristics such as very high melting point or specific thermal conductivity.

A resin-based sandwich laminate could also be fabricated with random or continuous webbed micron stainless steel fibers or other conductive fibers, forming a cloth like material. The webbed conductive fiber can be laminated or the like to materials such as Teflon, Polyesters, or any resin-based flexible or solid material(s), which when discretely designed in fiber content(s), orientation(s) and shape(s), will produce a very highly conductive flexible cloth-like material. Such a cloth-like material could also be used in forming circuit conductors that could be embedded in a person's clothing as well as other resin materials such as rubber(s) or plastic(s). When using conductive fibers as a webbed conductor as part of a laminate or cloth-like material, the fibers may have diameters of between about 3 and 12 microns, typically between about 8 and 12 microns or in the range of about 10 microns, with length(s) that can be seamless or overlapping.

The conductive loaded resin-based material of the present invention can be made resistant to corrosion and/or metal electrolysis by selecting micron conductive fiber and/or micron conductive powder and base resin that are resistant to corrosion and/or metal electrolysis. For example, if a corrosion/electrolysis resistant base resin is combined with stainless steel fiber and carbon fiber/powder, then a corrosion and/or metal electrolysis resistant conductive loaded resin-based material is achieved. Another additional and important feature of the present invention is that the conductive loaded resin-based material of the present invention may be made flame retardant. Selection of a flame-retardant (FR) base resin material allows the resulting product to exhibit flame retardant capability. This is especially important in circuit conductor applications as described herein.

The substantially homogeneous mixing of micron conductive fiber and/or micron conductive powder and base resin described in the present invention may also be described as doping. That is, the substantially homogeneous mixing converts the typically non-conductive base resin material into a conductive material. This process is analogous to the doping process whereby a semiconductor material, such as silicon, can be converted into a conductive material through the introduction of donor/acceptor ions as is well known in the art of semiconductor devices. Therefore, the present invention uses the term doping to mean converting a typically non-conductive base resin material into a conductive material through the substantially homogeneous mixing of micron conductive fiber and/or micron conductive powder into a base resin.

As an additional and important feature of the present invention, the molded conductor loaded resin-based material exhibits excellent thermal dissipation characteristics. Therefore, circuit conductors manufactured from the molded conductor loaded resin-based material can provide added thermal dissipation capabilities to the application. For example, heat can be dissipated from electrical devices physically and/or electrically connected to circuit conductors of the present invention.

As a significant advantage of the present invention, circuit conductors constructed of the conductive loaded resin-based material can be easily interfaced to an electrical circuit or grounded. In one embodiment, a wire can be attached to a conductive loaded resin-based circuit conductor via a screw that is fastened to the circuit conductor. For example, a simple sheet-metal type, self tapping screw, when fastened to the material, can achieve excellent electrical connectivity via the conductive matrix of the conductive loaded resin-based material. To facilitate this approach a boss may be molded into the conductive loaded resin-based material to accommodate such a screw. Alternatively, if a solderable screw material, such as copper, is used, then a wire can be soldered to the screw that is embedded into the conductive loaded resin-based material. In another embodiment, the conductive loaded resin-based material is partly or completely plated with a metal layer. The metal layer forms excellent electrical conductivity with the conductive matrix. A connection of this metal layer to another circuit or to ground is then made. For example, if the metal layer is solderable, then a soldered connection may be made between the circuit conductor and a grounding wire.

A typical metal deposition process for forming a metal layer onto the conductive loaded resin-based material is vacuum metallization. Vacuum metallization is the process where a metal layer, such as aluminum, is deposited on the conductive loaded resin-based material inside a vacuum chamber. In a metallic painting process, metal particles, such as silver, copper, or nickel, or the like, are dispersed in an acrylic, vinyl, epoxy, or urethane binder. Most resin-based materials accept and hold paint well, and automatic spraying systems apply coating with consistency. In addition, the excellent conductivity of the conductive loaded resin-based material of the present invention facilitates the use of extremely efficient, electrostatic painting techniques.

The conductive loaded resin-based material can be contacted in any of several ways. In one embodiment, a pin is embedded into the conductive loaded resin-based material by insert molding, ultrasonic welding, pressing, or other means. A connection with a metal wire can easily be made to this pin and results in excellent contact to the conductive loaded resin-based material. In another embodiment, a hole is formed in to the conductive loaded resin-based material either during the molding process or by a subsequent process step such as drilling, punching, or the like. A pin is then placed into the hole and is then ultrasonically welded to form a permanent mechanical and electrical contact. In yet another embodiment, a pin or a wire is soldered to the conductive loaded resin-based material. In this case, a hole is formed in the conductive loaded resin-based material either during the molding operation or by drilling, stamping, punching, or the like. A solderable layer is then formed in the hole. The solderable layer is preferably formed by metal plating. A conductor is placed into the hole and then mechanically and electrically bonded by point, wave, or reflow soldering.

Another method to provide connectivity to the conductive loaded resin-based material is through the application of a solderable ink film to the surface. One exemplary solderable ink is a combination of copper and solder particles in an epoxy resin binder. The resulting mixture is an active, screen-printable and dispensable material. During curing, the solder reflows to coat and to connect the copper particles and to thereby form a cured surface that is directly solderable without the need for additional plating or other processing steps. Any solderable material may then be mechanically and/or electrically attached, via soldering, to the conductive loaded resin-based material at the location of the applied solderable ink. Many other types of solderable inks can be used to provide this solderable surface-onto the conductive loaded resin-based material of the present invention. Another exemplary embodiment of a solderable ink is a mixture of one or more metal powder systems with a reactive organic medium. This type of ink material is converted to solderable pure metal during a low temperature cure without any organic binders or alloying elements.

Referring now to FIG. 1, a first preferred embodiment of the present invention is illustrated. A very low cost flexible circuit interface comprising conductive loaded resin-based material is shown. Several important features of the present invention are shown and discussed below. The first preferred embodiment 10 of the present invention shows a circuit 10 comprising a light 16, an electrical power source 20 and a switch 22. The battery source 20 and switch 22 are connected to the light 16 through two conductive loaded resin-based circuit conductors 12 and 14. The conductive loaded resin-based circuit conductors, or traces, 12 and 14 are fabricated from conductive loaded resin-based materials. The conductive loaded resin-based circuit conductors 12 and 14 have very low resistance due to the conductive materials substantially homogeneously mixed into the resin-based host. Under a positive voltage bias, current is therefore conducted through the conductive loaded resin-based circuit interfaces 12 and 14 to thereby power the light 16.

The conductive loaded resin-based circuit conductors of the present invention may be formed into almost any shape that is required for the application. In this example, the left side conductive loaded resin-based circuit conductor 12 has a zig-zag pattern with a rectangular cross section while the right side conductive loaded resin-based conductor 14 is a rod. Further, the conductive loaded resin-based circuit conductors may be flexible or non-flexible. In the example, the right side conductive loaded resin-based conductor 14 is flexible as demonstrated by the bending action 18. Flexible circuit conductors are fabricated according to the present invention by using resin-based materials that remain flexible after setting. For example, the resin-based material, Surlyn™ of the Dupont Corporation, may be used as the base resin host to fabricate the flexible conductive loaded resin-based circuit conductor 14.

A wide variety of flexible circuit shapes and sizes are possible using the conductive loaded resin-based material of the present invention. Any of the known methods for forming, molding, extruding, blow-molding, roto-molding, overmolding, insertion molding, calendaring, and the like, may used and may be combined with other manufacturing techniques, such as cutting, drilling, stamping, punching, heat pressing, and the like, to form the flexible circuit.

The resulting flexible circuit conductor exhibits lower weight than a comparable copper or aluminum conductor. In one embodiment, the conductive loaded resin-based material exhibits conductivity comparable to that of copper while only weighing about 40% as much as aluminum. Another advantage of the conductive loaded resin-based material conductors is that it is moldable into any number of shapes and sizes. Therefore, it is easy to mold a conductive circuit element into a device package or into another feature of a device. Another advantage of the conductive loaded resin-based circuit conductor is that it can be made more flexible than a metal wire-based conductor by choosing a flexible base resin. In addition, by choosing a high tensile strength base resin, the conductive loaded resin-based circuit conductor can be made to exhibit a higher tensile strength than a copper wire, or other metal wire, based system. Further, the network of conductive loading provides inherent reliability advantages where the material will continue to conduct even if a partial cracking or breakage in the circuit occurs due to the multitude of current pathways of the network.

Figure 7:
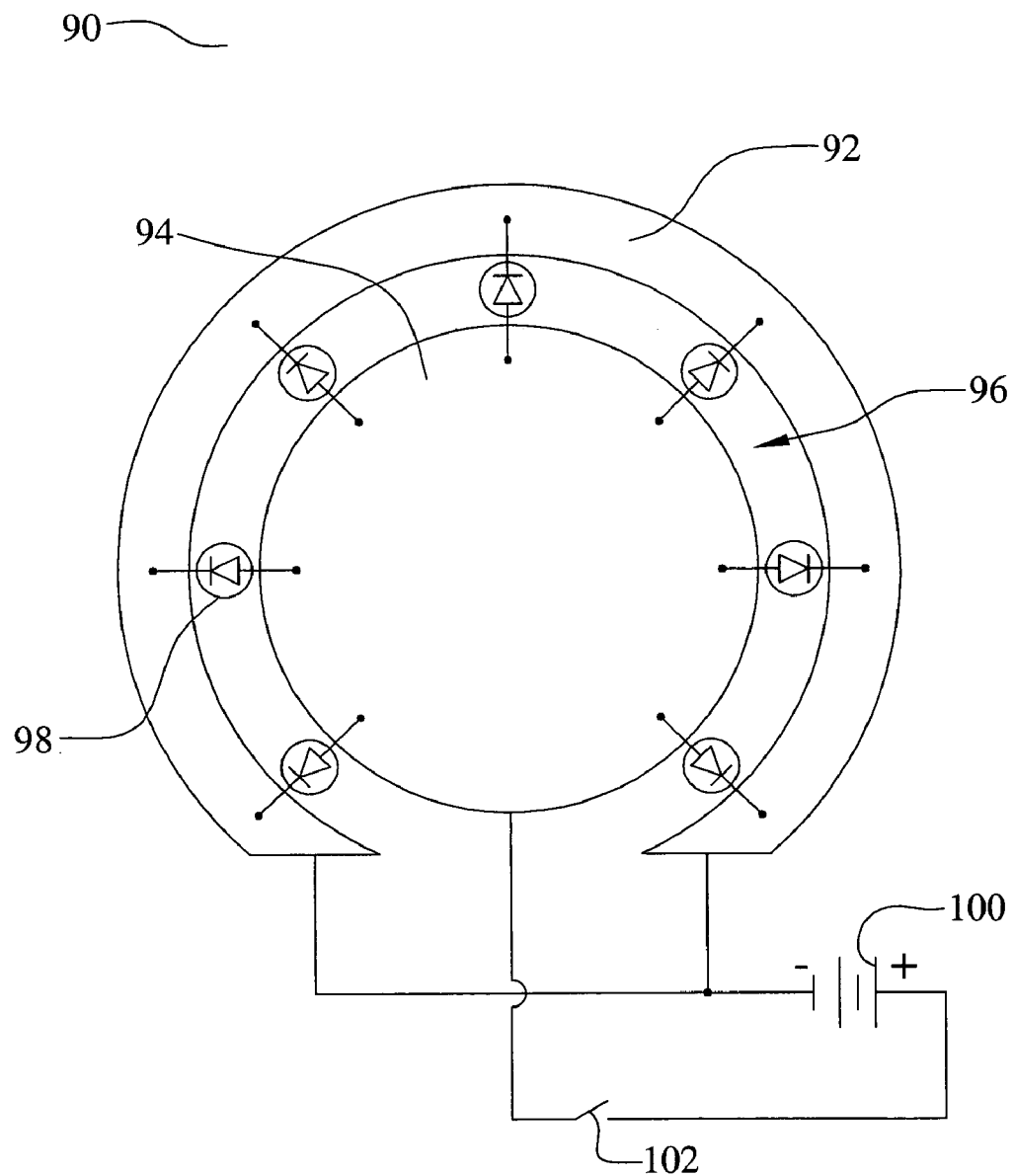
FIG. 7 illustrates a second preferred embodiment of the present invention showing a non-flexible circuit comprising conductive loaded resin-based material.

Referring now to FIG. 7, a second preferred embodiment of the present invention is illustrated. A circuit 90 is illustrated. In this case, a plurality of light emitting diodes 98 are connected in the space 96 between an interior circle conductor 94 and an exterior arch conductor 92. Both the interior circle conductor 94 and the exterior arch conductor 92 comprise conductive loaded resin-based materials of the present invention that have been fabricated into the desired shapes. Again, a battery source 100 and a switch 102 are used to control the current flow through the conductors 92 and 94 and to thereby control the ON/OFF state of the lights 98. In this case, the circuit conductors 92 and 94 are rigid, or non-flexible. To achieve a non-flexible circuit conductor, a rigid resin-based material, such as Noryl PPX™ from the General Electric Corporation or Lexan,™ is used as the resin base in fabrication of the conductive loaded resin-based circuit conductors 92 and 94.

Figure 8A:
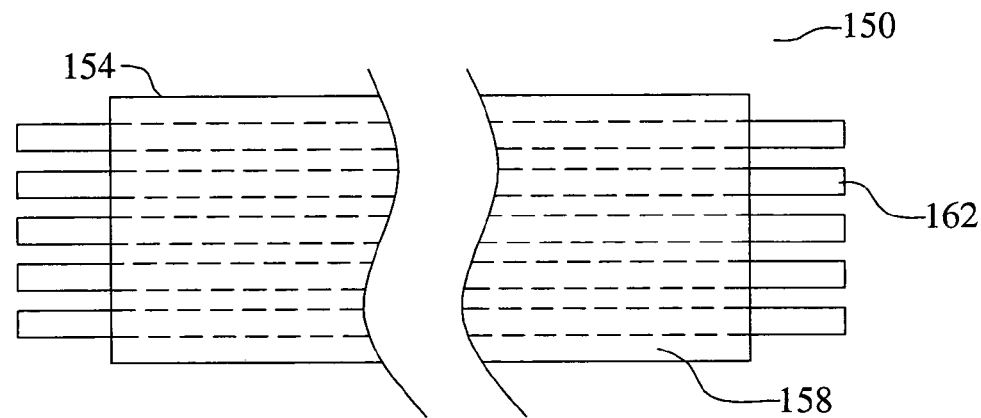
FIGS. 8a through 8c illustrates a third preferred embodiment of the present invention showing a flexible flat cable manufactured according to the present invention.
Figure 8B:
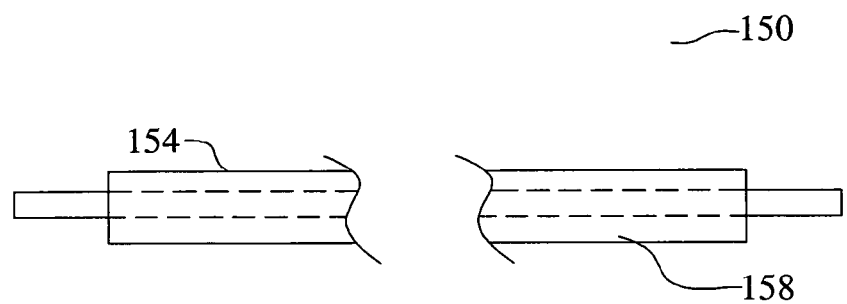
Figure 8C:
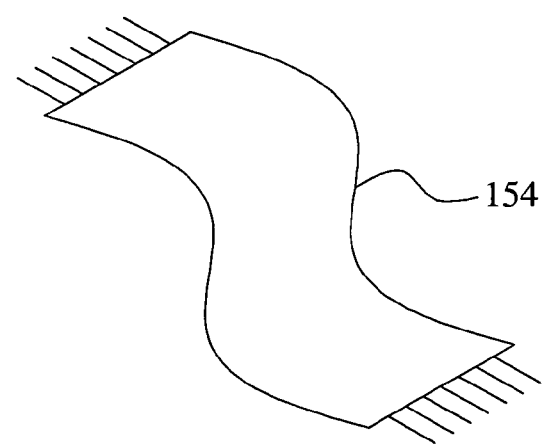

The flexible and non-flexible circuit conductors of the present invention can be used in many applications. An important application of the present invention is the manufacture of flat flexible cables (FFC). Referring now to FIGS. 8a, 8b, and 8c, a third preferred embodiment of the present invention is illustrated. A embodiment of a flat flexible cable 150 is shown. Flat flexible cables are used in many applications where multiple signals must be connected between sub-systems in an electronic system. As just one example, flat flexible cables may be used in a portable computing system to connect a display device, such as an LCD screen, to a display driving circuit. Flat flexible cables provide excellent interface capability while consuming minimal space and while fitting demanding routing contours.

In the prior art, most flexible flat cables are manufactured using tape or copper clad laminates and insulators. In one example, a group of parallel copper conductors is attached to a tape. An insulating material, such as polyester, is then extrusion molded overlying the conductor tape to providing electrical isolation. This process has serious design limitations, however, and tape-based FFC is not capable for complex, 3D designs. A more complex and expensive alternative to a tape-based FFC is to manufacture the FFC using a conductive ink. In this process, a layer of dielectric material is first screened onto a flexible substrate where the conductive ink is to be placed. The dielectric is then cured. Next, the conductive ink is screened on top of the dielectric layer, creating the circuitry. The ink must then be pre-dried and re-flowed to complete the proper connection. After the ink is cured, a second layer of dielectric is screen printed to cover and protect the conductor and make the trace less noticeable. As can be seen, this process is complex and time consuming. A third process that is used in the prior art is plating. In plating-based FFC, a conductive material, such as a copper or silver alloy, is plated onto a flexible substrate. This plated layer is then defined using lithography and etching techniques.

Referring again to FIGS. 8a, 8b, and 8c, a third preferred embodiment of the present invention is illustrated. A flat flexible cable 154 according to the present invention is illustrated in side, top, and isometric views. The FFC 154 of the present invention can be manufactured using fewer steps and at a lower cost than prior art methods described above. In addition, a wide range of design configurations and 3D shapes are possible. The flat flexible cable 154 comprises conductors 162 fabricated from the conductive loaded resin-based material described in the present invention. The conductors 162 are preferably routed in parallel to provide a block of signal interface connections. To provide a flexible cable, the resin base of the conductive loaded resin-based material comprises a base resin that remains flexible after setting. The FFC 154 further comprises an insulating material 158 to electrically isolate the conductors 162 for handling and routing purposes. To provide a flexible cable, the insulating material preferably comprises a resin-based material that will remain flexible after setting.

Figure 9:
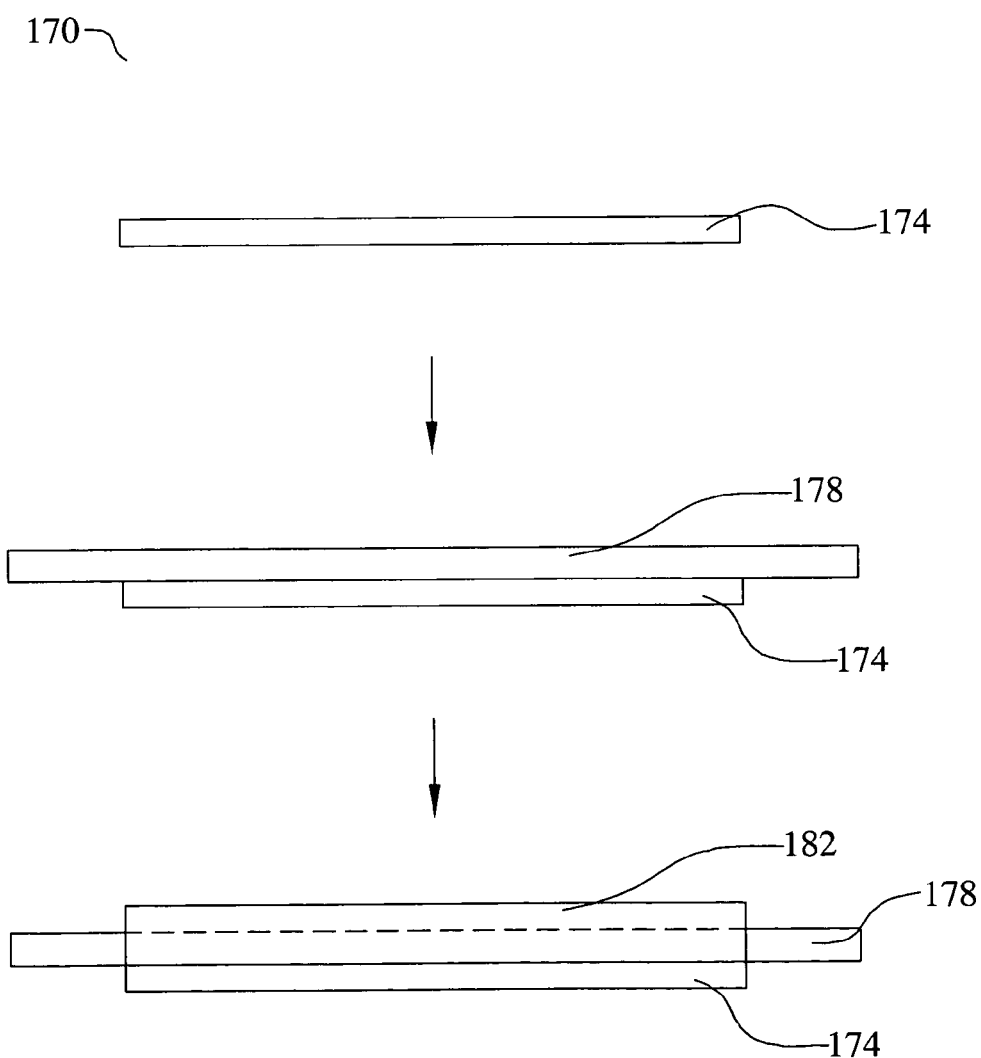
FIG. 9 illustrates a fourth preferred embodiment of the present invention showing a flexible flat cable fabricated by an over-molding process.

Referring now to FIG. 9, a fourth preferred embodiment of the present invention is illustrated. One exemplary method of fabricating a flat flexible cable according to the present invention is shown. First, a flexible insulator substrate 174 is fabricated as a substrate, or tape. This flexible insulator material 174 preferably comprises a resin-based material. The flexible insulator material 174 may be formed using any type of molding method(s), extrusion, stamping, cutting or the like. Next, a conductive loaded resin-based material 178, as described by the present invention, is over-molded onto the flexible insulator substrate 174. The over-molding process forms a group of parallel conductive lines 178 onto the flexible insulator substrate 174. This is illustrated in FIG. 8. Alternatively, any pattern of conductive traces may be formed by the over-molding process. Referring again to FIG. 9, preferably the base resin of the flexible insulator material 174 and the base resin of the conductive loaded, resin-based material 178 are chosen to achieve excellent adhesion between the conductive lines 178 and underlying tape/substrate 174.

After the conductive loaded resin-based conductors 178 are over-molded onto the substrate/tape 174, a second flexible insulating layer 182 is over-molded to encase the substrate 174 and conductors 178. Again, the second flexible insulating layer 182 preferably comprises a resin-based material and, more preferably, comprises a material with excellent adhesion to the conductors 178. One approach to fabricating the FFC according to this type of over-molding process is to use a single type of base resin for the flexible insulator substrate 174, the conductors 178, and the second flexible insulating layer 182. In this way, a resin can be chosen based on optimal mechanical, chemical, and environmental properties. The completed FFC assembly 170 will exhibit these properties while additionally providing excellent electrical interfacing through the conductive loaded resin-based conductors 178.

The above-described over-molding process may further be integrated as an extrusion process to fabricate long strands of flat flexible tape. In this case, the conductors 178 are first extrusion molded onto the flexible substrate/tape layer 174. Next, the second flexible insulating layer 182 is extrusion molded onto the conductors 178 and the substrate/tape layer 174 subassembly. Finally, the flat flexible cable process may be extended to forming non-flexible cables by selecting non-flexible base resins for the conductor and insulator materials.

Figure 10A:
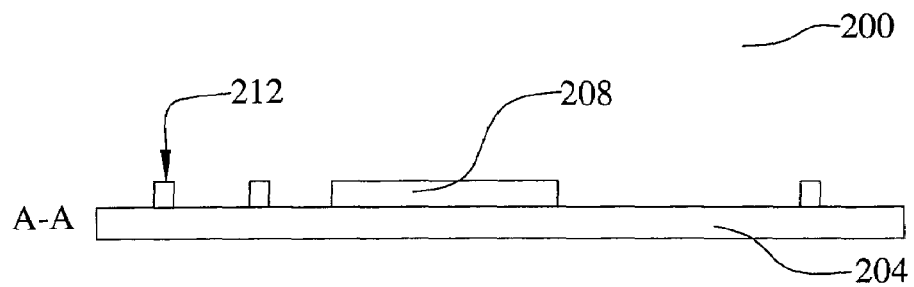
FIGS. 10a, 10b, and 10c illustrate a fifth preferred embodiment of the present invention showing a circuit board manufactured according to the present invention.
Figure 10B:
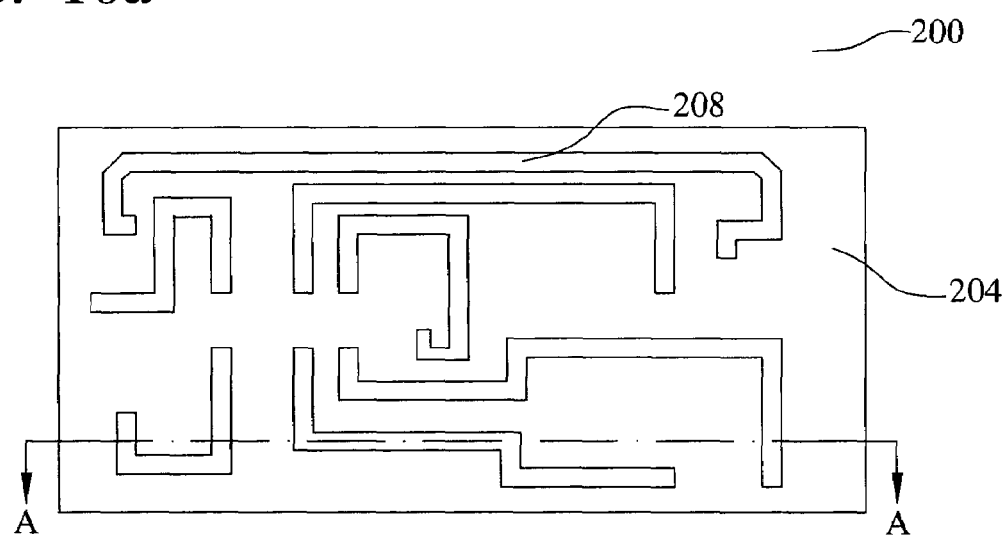
Figure 10C:
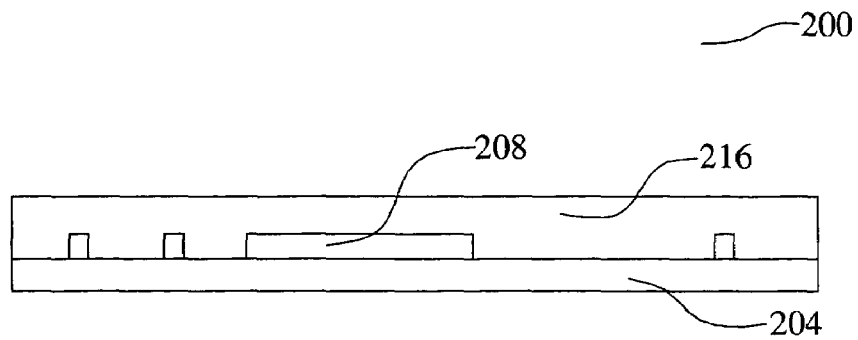

Referring now to FIGS. 10a, 10b, and 10c, a fifth preferred embodiment 200 of the present invention is illustrated. Another conductive circuit according to the present invention is shown. A complex circuit board 200, such as would be useful for an electronic system or sub-system, is formed by the method of the present invention. A conductive loaded resin based material 208 is over-molded onto an insulating substrate or board 204 as is shown in cross sectional view in FIG. 10a and in top view in FIG. 10b. Following the over-molding of the conductive lines or traces 208 onto the board 204, an insulating material 216 is formed overlying both the traces 208 and the board as is shown in FIG. 10c.

Figure 11A:
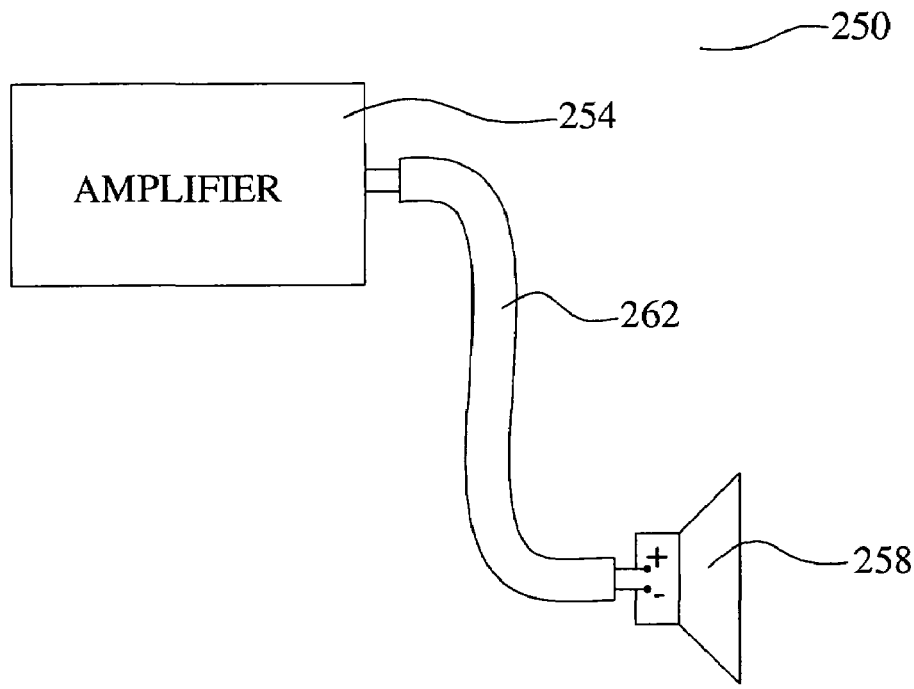
FIGS. 11a, 11b, and 11c illustrate a sixth preferred embodiment of the present invention showing the application of the present invention to flat, flexible speaker cables.
Figure 11B:
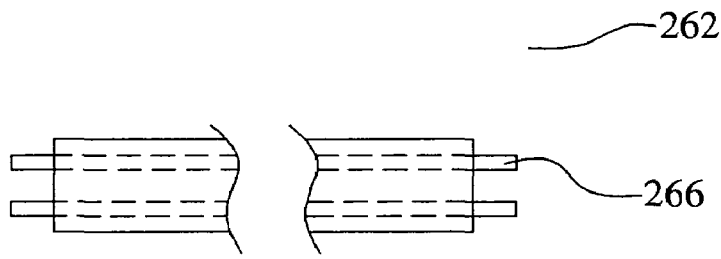
Figure 11C:
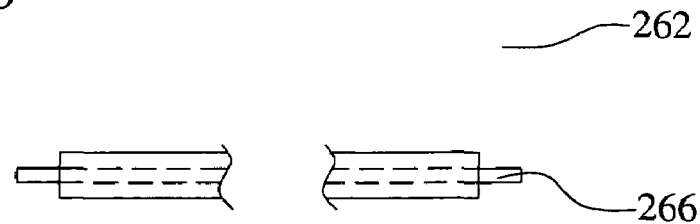

A particularly useful application of the FFC method of the present invention is in the manufacture of speaker wiring. Referring now to FIGS. 11a, 11b, and 11c, a sixth preferred embodiment of the present invention is illustrated. A flat flexible speaker cable 262 is shown for providing an electrical interface between an amplifier circuit 254 and an acoustical speaker 258. A light weight and low manufacturing cost speaker cable is 262 formed using, for example, the FFC method described above. The conductors 266 in the cables are formed using conductive loaded resin-based materials. The speaker cables may be made to have a very thin profile. Further, if an adhesive layer is formed on one side of the cable, then the speaker cable 262 can be applied to a wall for easy routing in an existing residential application. Further, the insulating outer layer of the cable can be formed of a resin-based material that can be easily painted.

Figure 12A:
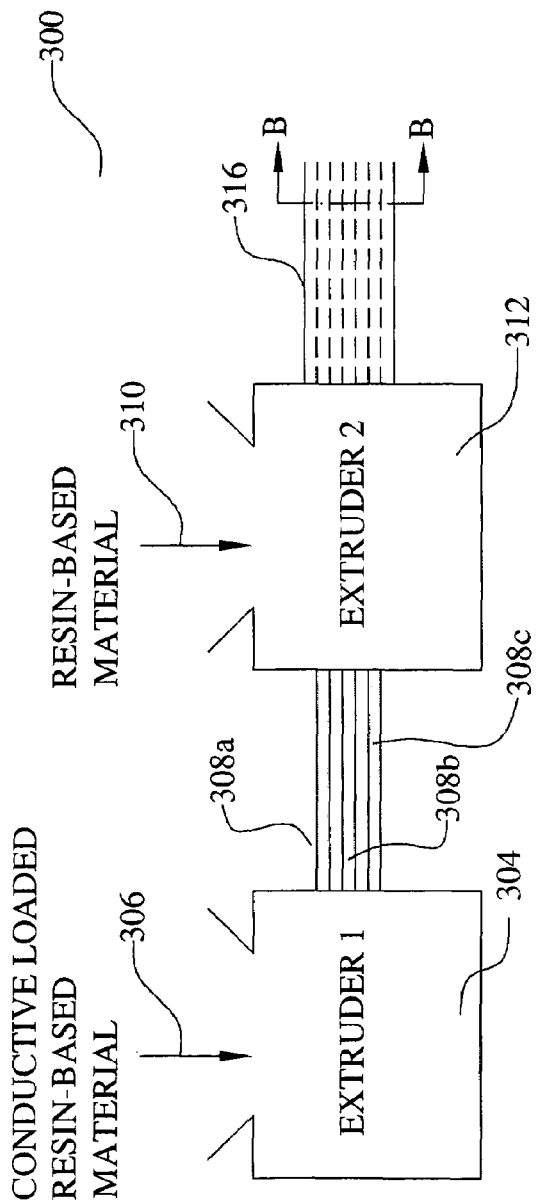
FIGS. 12a and 12b illustrate a seventh preferred embodiment of the present invention showing an extrusion method for forming a multiple conductor, flexible cable.
Figure 12B:
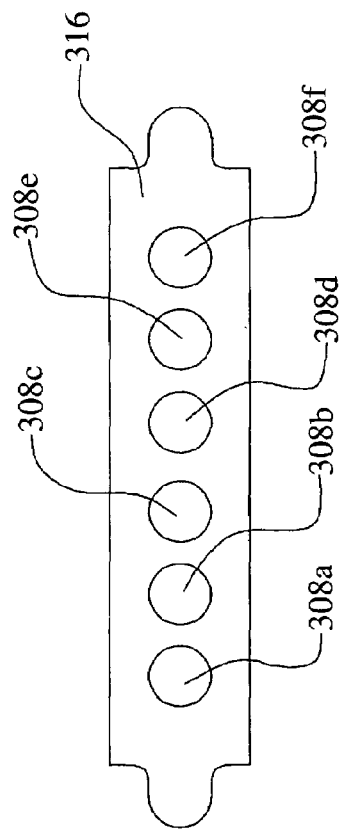

Referring now to FIGS. 12a and 12b, a seventh preferred embodiment of the present invention is illustrated. Referring particularly to FIG. 12a, a method 300 for forming a multiple conductor, flexible cable is shown. First, the conductive loaded resin-based material 306 of the present invention is processed through an extruder EXTRUDER1 304 to form a plurality of conductors 308a, 308b, and 308c. The conductive loaded resin-based material forms conductors of high conductivity, even as high as copper wire, by the unique substantial homogenization of the conductive loading into the resin-based material to form a network of conductive elements in the resin matrix. In the illustrated embodiment, a single extruder 304 is used to extrude multiple conductors 308a, 308b, and 308c. In other embodiments, multiple extruders are used to produce a plurality of conductive loaded resin-based material conductors. In another embodiment, the conductive loaded resin-based material conductors are first formed and then are wound onto a spooling device. Then these pre-formed conductive loaded resin-based material conductors are unwound and pulled through a second extrusion process EXTRUDER2 312. In the second process 312, a resin-based material 310 is extruded onto the plurality of conductive loaded resin-based material conductors 308a, 308b, and 308c. Preferably a pultrusion process is used wherein the conductive loaded resin-based material conductors 308a, 308b, and 308c are pulled through a die in the second extruder 312. The resin-based material 310 is melted in the second extruder 312 and flowed into the die. As the conductors 308a, 308b, and 308c pass through the die, the resin-based material adheres to these conductors to form an outer extrusion layer 316. This outer layer 316 insulates the conductive loaded resin-based material conductors 308a, 308b, and 308c from each other and from outside electrical contact. Referring particularly to FIG. 12b, the completed multiple conductor, flexible cable is shown in cross section. Once again, to achieve a flexible cable, flexible resin-based materials must be chosen for the conductive loaded resin-based material 306 and the outer resin-based material 310.

Figure 2:
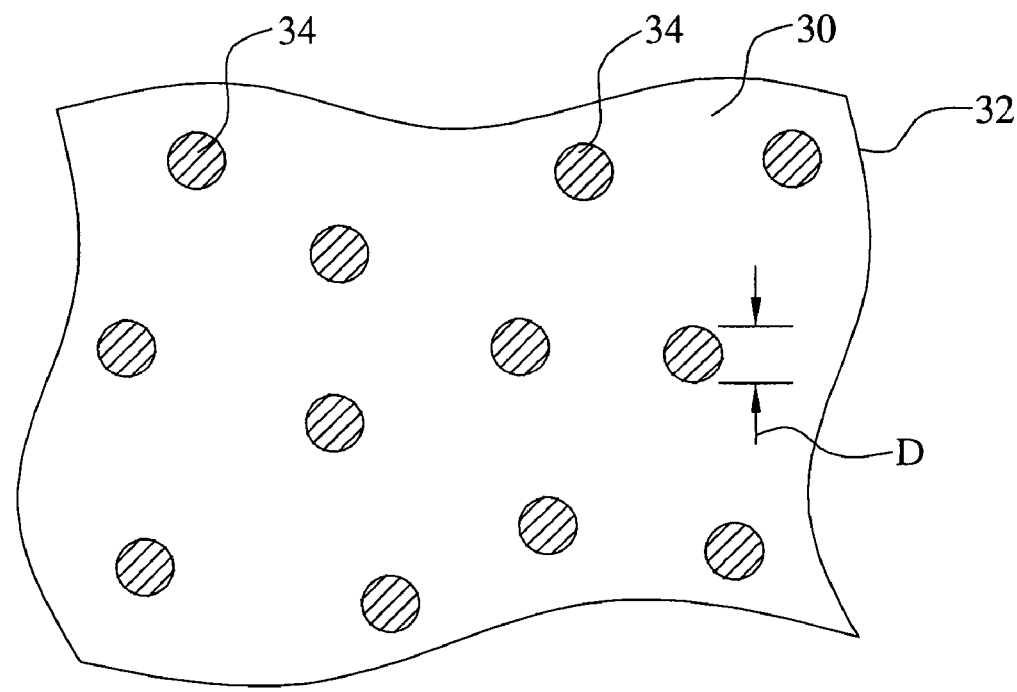
FIG. 2 illustrates a first preferred embodiment of a conductive loaded resin-based material wherein the conductive materials comprise a powder.

The conductive loaded resin-based material of the present invention typically comprises a micron powder(s) of conductor particles and/or in combination of micron fiber(s) substantially homogenized within a base resin host. FIG. 2 shows cross section view of an example of conductor loaded resin-based material 32 having powder of conductor particles 34 in a base resin host 30. In this example the diameter D of the conductor particles 34 in the powder is between about 3 and 12 microns.

Figure 3:
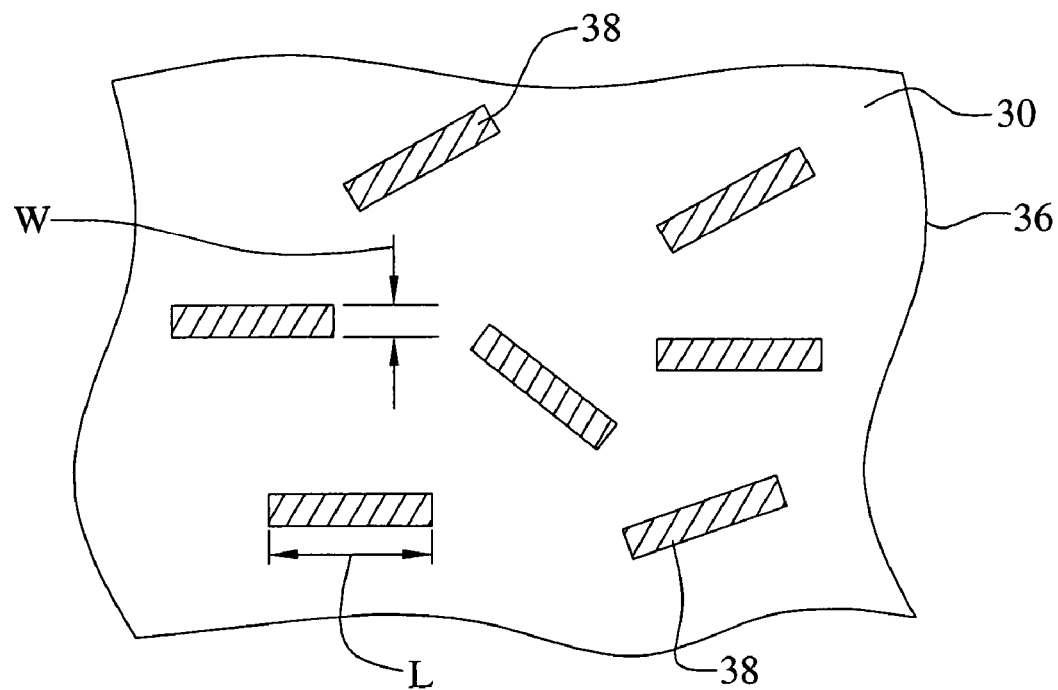
FIG. 3 illustrates a second preferred embodiment of a conductive loaded resin-based material wherein the conductive materials comprise micron conductive fibers.
Figure 4:
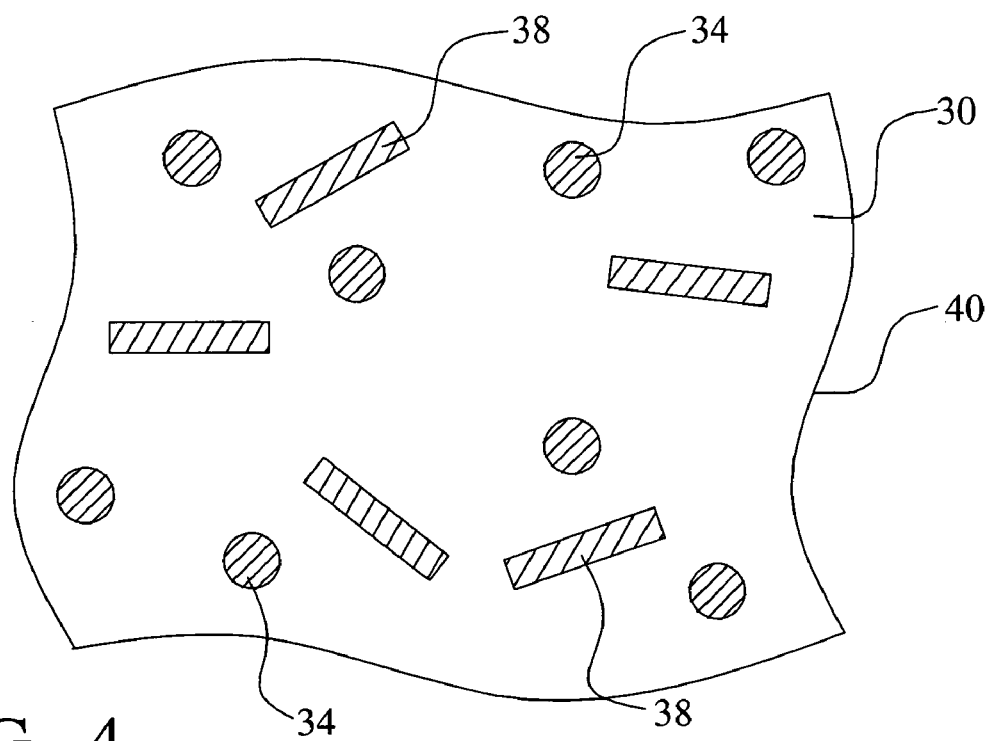
FIG. 4 illustrates a third preferred embodiment of a conductive loaded resin-based material wherein the conductive materials comprise both conductive powder and micron conductive fibers.

FIG. 3 shows a cross section view of an example of conductor loaded resin-based material 36 having conductor fibers 38 in a base resin host 30. The conductor fibers 38 have a diameter of between about 3 and 12 microns, typically in the range of 10 microns or between about 8 and 12 microns, and a length of between about 2 and 14 millimeters. The conductors used for these conductor particles 34 or conductor fibers 38 can be stainless steel, nickel, copper, silver, aluminum, or other suitable metals or conductive fibers, or combinations thereof. These conductor particles and or fibers are substantially homogenized within a base resin. As previously mentioned, the conductive loaded resin-based materials have a sheet resistance between about 5 and 25 ohms per square, though other values can be achieved by varying the doping parameters and/or resin selection. To realize this sheet resistance the weight of the conductor material comprises between about 20% and about 50% of the total weight of the conductive loaded resin-based material. More preferably, the weight of the conductive material comprises between about 20% and about 40% of the total weight of the conductive loaded resin-based material. More preferably yet, the weight of the conductive material comprises between about 25% and about 35% of the total weight of the conductive loaded resin-based material. Still more preferably yet, the weight of the conductive material comprises about 30% of the total weight of the conductive loaded resin-based material. Stainless Steel Fiber of 6-12 micron in diameter and lengths of 4-6 mm and comprising, by weight, about 30% of the total weight of the conductive loaded resin-based material will produce a very highly conductive parameter, efficient within any EMF spectrum. Referring now to FIG. 4, another preferred embodiment of the present invention is illustrated where the conductive materials comprise a combination of both conductive powders 34 and micron conductive fibers 38 substantially homogenized together within the resin base 30 during a molding process.

Figure 5A:
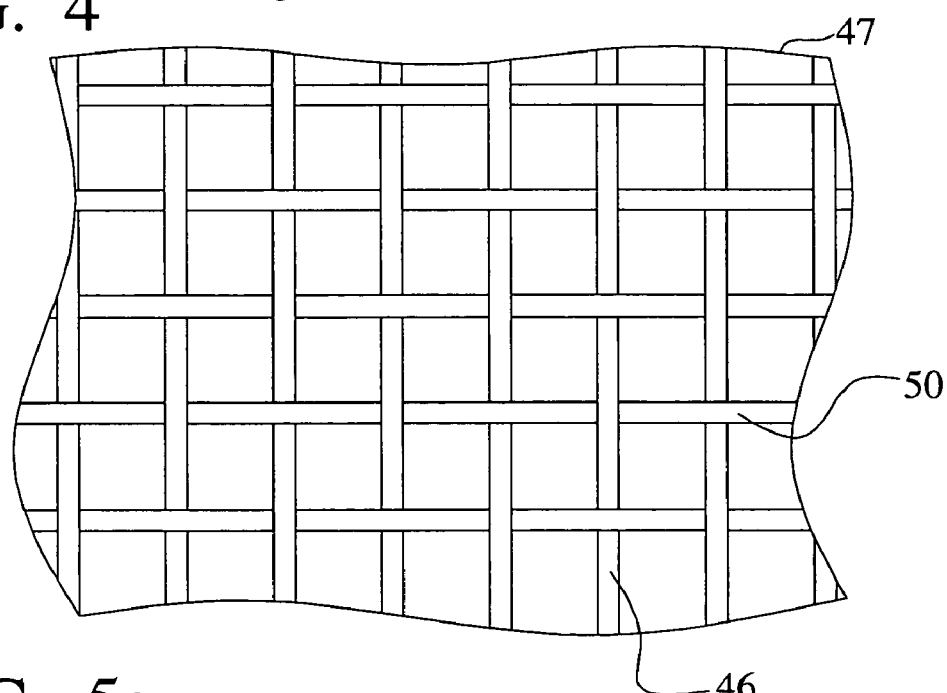
FIGS. 5a and 5b illustrate a fourth preferred embodiment wherein conductive fabric-like materials are formed from the conductive loaded resin-based material.
Figure 5B:
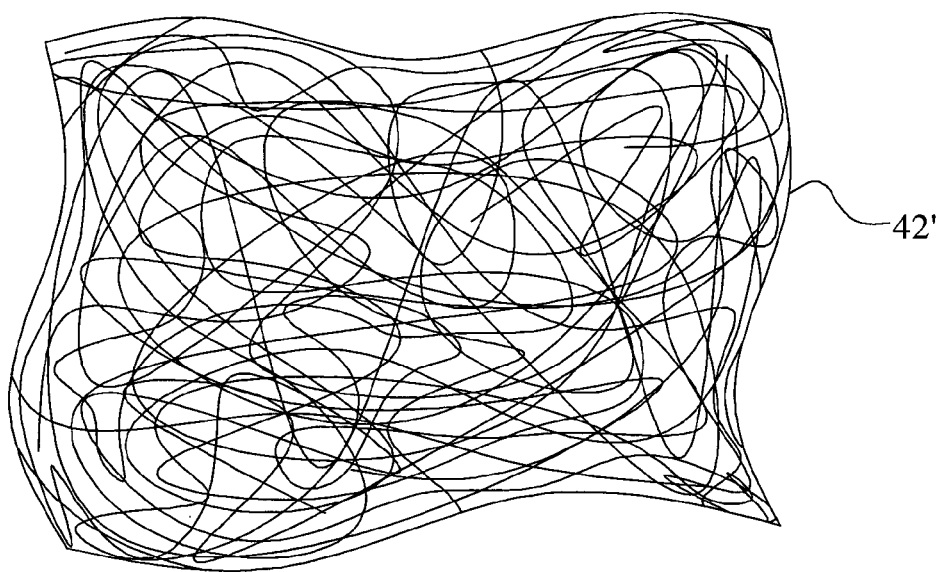

Referring now to FIGS. 5a and 5b, a preferred composition of the conductive loaded, resin-based material is illustrated. The conductive loaded resin-based material can be formed into fibers or textiles that are then woven or webbed into a conductive fabric. The conductive loaded resin-based material is formed in strands that can be woven as shown. FIG. 5a shows a conductive fabric 42 where the fibers are woven together in a two-dimensional weave 46 and 50 of fibers or textiles. FIG. 5b shows a conductive fabric 42' where the fibers are formed in a webbed arrangement. In the webbed arrangement, one or more continuous strands of the conductive fiber are nested in a random fashion. The resulting conductive fabrics or textiles 42, see FIG. 5a, and 42', see FIG. 5b, can be made very thin, thick, rigid, flexible or in solid form(s).

Similarly, a conductive, but cloth-like, material can be formed using woven or webbed micron stainless steel fibers, or other micron conductive fibers. These woven or webbed conductive cloths could also be sandwich laminated to one or more layers of materials such as Polyester(s), Teflon(s), Kevlar(s) or any other desired resin-based material(s). This conductive fabric may then be cut into desired shapes and sizes.

Figures 6A, 6B:
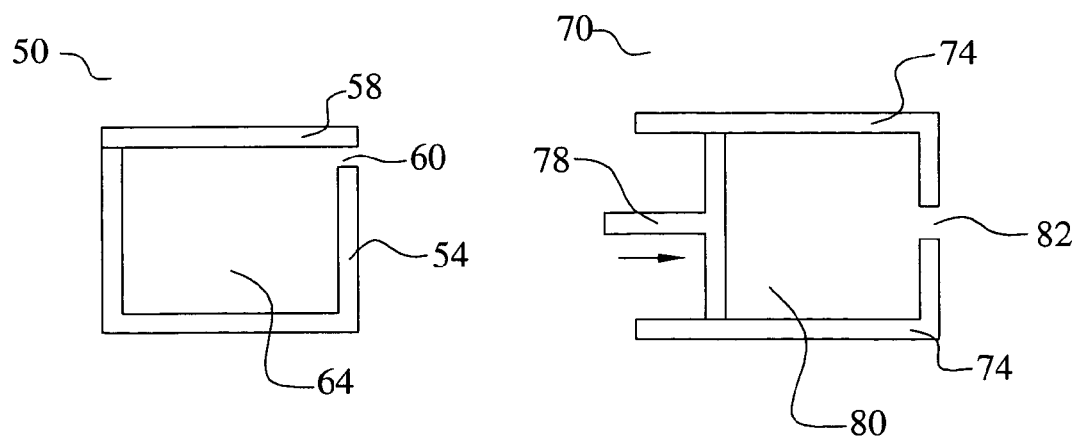
FIGS. 6a and 6b illustrate, in simplified schematic form, an injection molding apparatus and an extrusion molding apparatus that may be used to mold circuit cables of a conductive loaded resin-based material.

Circuit conductors formed from conductive loaded resin-based materials can be formed or molded in a number of different ways including injection molding, extrusion or chemically induced molding or forming. FIG. 6a shows a simplified schematic diagram of an injection mold showing a lower portion 54 and upper portion 58 of the mold 50. Conductive loaded blended resin-based material is injected into the mold cavity 64 through an injection opening 60 and then the substantially homogenized conductive material cures by thermal reaction. The upper portion 58 and lower portion 54 of the mold are then separated or parted and the circuit conductors are removed.

FIG. 6b shows a simplified schematic diagram of an extruder 70 for forming circuit conductors using extrusion. Conductive loaded resin-based material(s) is placed in the hopper 80 of the extrusion unit 74. A piston, screw, press or other means 78 is then used to force the thermally molten or a chemically induced curing conductive loaded resin-based material through an extrusion opening 82 which shapes the thermally molten curing or chemically induced cured conductive loaded resin-based material to the desired shape. The conductive loaded resin-based material is then fully cured by chemical reaction or thermal reaction to a hardened or pliable state and is ready for use. Thermoplastic or thermosetting resin-based materials and associated processes may be used in molding the conductive loaded resin-based articles of the present invention.

The advantages of the present invention may now be summarized. An effective circuit conductor and circuit cable are achieved. Methods to form circuit conductors and circuit cables are achieved. Performance or visual characteristics of the circuit conductor or cable molded of conductive loaded resin-based material can be altered by forming a metal layer over the conductive loaded resin-based material. Circuit conductors and cables having high flexibility and tensile strength are achieved.

As shown in the preferred embodiments, the novel methods and devices of the present invention provide an effective and manufacturable alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A conductor device comprising:
   a conductor comprising a conductive loaded, resin-based material comprising conductive materials in a base resin host; and
   an insulating layer surrounding said conductor.

2. The device according to claim 1 wherein the percent by weight of said conductive materials is between about 20% and about 50% of the total weight of said conductive loaded resin-based material.

3. The device according to claim 1 wherein said conductive materials comprise micron conductive fiber.

4. The device according to claim 2 wherein said conductive materials further comprise conductive powder.

5. The device according to claim 1 wherein said conductive materials are metal.

6. The device according to claim 1 wherein said conductive materials are non-conductive materials with metal plating.

7. The device according to claim 1 wherein said conductor comprises a flexible resin-based material.

8. The device according to claim 7 wherein said insulating layer comprises a flexible resin-based material.

9. The device according to claim 1 wherein said conductor and said insulating layer each comprise the same type of resin-based material.

10. The device according to claim 1 further comprising at least one additional conductor of said conductive loaded resin-based material wherein said conductors are electrically isolated one from the other by said insulating layer.

11. The device according to claim 1 wherein said conductor is a line on said insulating layer.

12. A conductor device comprising:
    a plurality of conductors each comprising a conductive loaded, resin-based material comprising conductive materials in a base resin host wherein the percent by weight of said conductive materials is between 20% and 40% of the total weight of said conductive loaded resin-based material; and
    an insulating layer surrounding each said conductor.

13. The device according to claim 12 wherein said conductive materials are nickel plated carbon micron fiber, stainless steel micron fiber, copper micron fiber, silver micron fiber or combinations thereof.

14. The device according to claim 12 wherein said conductive materials comprise micron conductive fiber and conductive powder.

15. The device according to claim 14 wherein said conductive powder is nickel, copper, or silver.

16. The device according to claim 14 wherein said conductive powder is a non-conductive material with a metal plating of nickel, copper, silver, or alloys thereof.

17. The device according to claim 12 wherein said conductor comprises a flexible resin-based material.

18. The device according to claim 17 wherein said insulating layer comprises a flexible resin-based material.

19. The device according to claim 12 wherein said conductor and said insulating layer each comprise the same type of resin-based material.

20. The device according to claim 12 wherein said conductor is a speaker cable.

21. A conductor device comprising:
    A plurality of conductors each comprising a conductive loaded, resin-based material comprising micron conductive fibers in a base resin host wherein the percent by weight of said micron conductive fibers is between 25% and 35% of the total weight of said conductive loaded resin-based material; and
    an insulating layer surrounding each said conductor.

22. The device according to claim 21 wherein said micron conductive fiber is stainless steel.

23. The device according to claim 21 further comprising conductive powder.

24. The device according to claim 21 wherein said micron conductive fiber has a diameter of between about 3 µm and about 12 µm and a length of between about 2 mm and about 14 mm.

25. The device according to claim 21 wherein said conductor and said insulating layer each comprises a flexible resin-based material.

* * * * *